US006866943B2

(12) United States Patent
Friese et al.

(10) Patent No.: US 6,866,943 B2
(45) Date of Patent: Mar. 15, 2005

(54) BOND PAD STRUCTURE COMPRISING TUNGSTEN OR TUNGSTEN COMPOUND LAYER ON TOP OF METALLIZATION LEVEL

(75) Inventors: Gerald Friese, Munich (DE); Werner K. Robl, Poughkeepsie, NY (US); Hans-Joachim Barth, Munich (DE); Axel Brintzinger, Dresden (DE)

(73) Assignee: Infineon Technologies AG, Munich (DE)

( * ) Notice: Subject to any disclaimer, the term of this patent is extended or adjusted under 35 U.S.C. 154(b) by 88 days.

(21) Appl. No.: 10/134,617

(22) Filed: Apr. 30, 2002

(65) Prior Publication Data

US 2003/0203216 A1 Oct. 30, 2003

(51) Int. Cl.⁷ ............................................. B21D 39/00
(52) U.S. Cl. ....................... 428/621; 428/641; 428/651; 428/663; 428/665; 428/450; 428/698; 257/734; 257/740
(58) Field of Search ................................ 428/621, 641, 428/651, 663, 665, 450, 698, 697; 257/740, 734

(56) References Cited

U.S. PATENT DOCUMENTS

| | | | |
|---|---|---|---|
| 4,824,803 A | | 4/1989 | Us et al. |
| 4,862,232 A | | 8/1989 | Lee |
| 5,384,284 A | * | 1/1995 | Doan et al. ................ 438/610 |
| 5,441,917 A | * | 8/1995 | Rostoker et al. ............ 438/612 |
| 5,703,408 A | * | 12/1997 | Ming-Tsung et al. ....... 257/784 |
| 5,834,125 A | | 11/1998 | Lien ........................... 428/448 |
| 5,882,999 A | | 3/1999 | Anderson et al. ........... 438/629 |
| 5,942,800 A | * | 8/1999 | Yiu et al. .................... 257/754 |
| 5,985,765 A | | 11/1999 | Hsiao et al. |
| 6,051,369 A | | 4/2000 | Azuma et al. |
| 6,147,409 A | | 11/2000 | Hsia et al. |
| 6,180,503 B1 | * | 1/2001 | Tzeng et al. ................ 438/601 |
| 6,258,706 B1 | | 7/2001 | Yiu et al. |
| 6,306,749 B1 | | 10/2001 | Lin |
| 6,319,758 B1 | | 11/2001 | Liaw .......................... 438/132 |
| 6,365,511 B1 | | 4/2002 | Kizilyalli et al. |
| 6,365,967 B1 | | 4/2002 | Akram et al. |
| 6,365,970 B1 | | 4/2002 | Tsai et al. ................... 257/751 |
| 6,373,137 B1 | * | 4/2002 | McTeer ...................... 257/762 |

FOREIGN PATENT DOCUMENTS

| | | |
|---|---|---|
| JP | 04000731 | 1/1992 |
| JP | 06177200 | 6/1994 |

OTHER PUBLICATIONS

Ching et al. Bond Pad Stucture Reliability, IEEE/IRPS 1988 pp. 64–70. No month.*

Tao et al., Characterization and Modeling of Electromigration Failures in Multilayered Interconnects and Barrier Layer Materials, IEEE Transactions On Electron Devices, vol. 43, No. 11, Nov. 1996, pp. 1819–1824.

* cited by examiner

*Primary Examiner*—Stephen Stein

(57) ABSTRACT

A bond pad structure formed over a predetermined area of an IC substrate comprising quickly and easily removable redundancy and passivation layers upon lithography and plasma etching in a plasma containing $Cl_2$, the bond structure comprises: a liner or lower metal layer formed on a predetermined area of the IC substrate; an aluminum-based metal layer formed on the liner layer as the last metal layer for bond purposes; a tungsten based redundancy layer formed on top of the aluminum-based last metal layer; and a passivation layer formed over the IC substrate and on the tungsten based redundancy layer.

18 Claims, 2 Drawing Sheets

BOND PAD STRUCTURE COMPRISING TUNGSTEN OR TUNGSTEN COMPOUND LAYER ON TOP OF METALLIZATION LEVEL

BACKGROUND OF THE INVENTION

1. Field of Invention

The invention relates to bond pad structures for integrated circuits (IC) or semiconductor devices that use Al as the last metal for bond purposes, and employs tungsten or a tungsten compound layer as the top layer of the last metal stack, and wherein the tungsten or tungsten compound layer may function as a redundancy or anti-reflecting coat on top of the top metallization layer in the bond pad structure.

2. Description of the Prior Art

A passivation layer etching process for memory arrays with fusable links is disclosed in U.S. Pat. No. 6,180,503 B1. The memory arrays with fusable links are obtained by etching the laser access opening in two steps using a transient etch stop layer between the first and second step. After a fuse is formed in a polysilicon level, an etch stop pad is patterned in a higher level metal or polysilicon level over the rupture zone of the fuse. The fuse access opening is then partially formed concurrent with a via etch which penetrates a thick IMD layer. The etch stop pad limits the penetration over the rupture zone to only the IMD layer. The etch stop pad is removed during a metal patterning etch. The second and final portion of the access opening is then formed during patterning of the passivation layer. Because the etch stop pad has already been removed at passivation etching, the bonding pads opening and the final fuse access opening can be accomplished by a single mask.

U.S. Pat. No. 6,319,758 disclose redundancy structures in self-aligned contact processes. The redundancy structure for implementation of redundant circuits within a IC placed on a semiconductor substrate includes a fusable link.

The fusible link is formed of a layer of a conductive material deposited upon an insulating layer of the semiconductor substrate connected between the redundant circuits and other circuits present on the integrated circuit. The insulating layer is generally a layer of field oxide placed on the surface of the semiconductor substrate. The layer of conductive material is either formed of a metal such as Aluminum (Al) or Tungsten (W), a heavily doped polycrystalline silicon, or an alloy of a metal such as Tungsten (W) and a heavily doped polycrystalline silicon.

A bond pad structure and method of fabricating the same is disclosed in U.S. Pat. No. 6,365,970 B1. The bond pad structure comprises:

a lower metal layer formed over the predetermined area;

a dielectric layer formed on the lower metal layer, the dielectric layer having via openings formed through the dielectric layer on the first, second and third areas only, respectively;

a first diffusion barrier layer formed over the dielectric layer and the sidewalls and bottom of the via openings;

via plugs formed by filling a metal material into the via openings;

a second diffusion barrier layer formed over the first diffusion barrier layer and via plugs; and an upper metal layer formed over the second diffusion barrier layer.

U.S. Pat. No. 5,882,999 discloses a process for metallization of an insulator layer in integrated circuits. The process involves depositing an antireflective coating layer of a material such as TiN over the insulator layer, patterning both the ARC and the insulator with a series of channels or apertures vias and depositing a metal such as tungsten over the ARC and in the channels and apertures.

A non-reactive anti-reflection coating is disclosed in U.S. Pat. No. 5,834,125. The anti-reflective coating is comprised of a barrier layer and an anti-reflective layer. The barrier layer is comprised of a material which prevents reactions between the anti-reflective layer and underlying layers or substrates, does not make the anti-reflective layer reflective, and preferably does not react with either the reflective layer or the anti-reflective layer. In particular embodiments of the invention, the barrier layer is a thin layer of silicon dioxide $SiO_2$ or silicon nitride $Si_3N_4$, and the anti-reflective layer is titanium-tungsten TiW, titanium nitride TiN, or amorphous silicon.

Tao et al., CHARACTERIZATION AND MODELING OF ELECTROMIGRATION FAILURES IN MULTILAYERED INTERCONNECTS AND BARRIER LAYER MATERIALS, IEEE Transactions On Electron Devices, Volume 43, No. 11, November 1996, pages 1819–1824, disclose electromigration performance of TiN/Al-alloy/TiN multilayered interconnects and TiN and TiW barrier layer materials, wherein damaged healing observed in multilayered interconnects is demonstrated to the due to the stress induced during Al electromigration instead of joule heating.

There is a need to find and deploy a substitute for Ti and Ti compounds in lieu of the fact that Ti and its compounds are difficult and slow to remove by fluorine chemistry, when the Ti materials are used as top layers on the last metal stack of an IC or semiconductor device, such as a bond pad structure, where bond pad structures provide an IC chip with location for bonding wires or other connectors. The need is apparent when it is considered that, when the IC chip is fabricated, yield of the chip is directly related to the reliability of the bond pad on itself. This is so because, when the bond pad is manufactured, the bond pad of the IC chip tends to deteriorate from damages during later probe test procedures and wire bonding processing.

SUMMARY OF THE INVENTION

In an IC or DRAM cell device or chip, wherein a fuse is formed in a polysilicon layer, and wherein Al or its alloy is deposited on a liner as a metal layer conductive material, followed by a deposition of a redundancy layer and a passivation layer, it is an object of the invention to find and deploy as a top metal on the Al or its alloy, a redundancy layer and anti-reflective coating so that upon lithography and plasma etching in a plasma containing $Cl_2$, unlike when Ti and its compounds are used as the redundancy layer, the final passivation over the bond area is quickly and completely removed.

Another object of the present invention is, in the case of an IC or DRAM cell device or chip, wherein a fuse is formed in a polysilicon layer, to utilize W and its compounds as a top metal on Al or its alloy so that upon lithography and plasma etching in a plasma containing $Cl_2$, the final passivation over the bond area is quickly and completely removed.

In general, the bond pad structure of the IC or DRAM cell device or chip of the invention in which a fuse is formed in the polysilicon layer is obtained using conventional DRAM making procedures, except that, in lieu of Ti or its compounds, W or its compounds are employed as a top or redundancy layer on top of the last metal or Al that is used as the bond pad material.

Further, W or its compounds (non-titanium) may also function as a redundancy layer and as an anti-reflective coating at lithography.

BRIEF DESCRIPTION OF THE DRAWING FIGURES

DETAILED DESCRIPTION OF PREFERRED EMBODIMENT OF THE INVENTION

Figure 1:
FIG. 1 is a simplified cross sectional view of an IC of the invention depicting a conventional Ti based liner on which there is deposited a metal layer of Al or its compound, a W based redundancy layer on top of the interconnecting line, and a passivation layer.

Reference is now-made to FIG. 1, which is a simplified cross sectional view of an integrated circuit (IC), DRAM cell device or chip 10, that may be formed in a polysilicon layer. In manufacturing this memory chip certain steps are taken to circumvent defective components and these steps may include additional segments of memory circuits provided on the IC chip as replacements for defective segments, and the way in which redundant segments are used and defective segments deleted is by use of laser trimming.

The IC chip structure of FIG. 1 comprises a conventional Ti based liner 11 and a metal layer 12 of Al or an Al compound, such as AlCu deposited thereon for purposes of forming a bond. Suitable Ti based liner material include, as examples only, Ti, TiN and TiW. Another suitable aluminum-based metal layer 12 is AlCuSi. A redundancy layer 13 (present on top of interconnecting line) which may be deposited by sputtering, is deposited on layer 12; however, in the context of the invention the redundancy layer is W or its compounds (non-titanium) including $WSi_2$ instead of the well known Ti or its compounds, so as to enable quick and complete removal of W and the final passivation layer 14 over the fuse and/or bonding pad region layer formed.

Passivation layer 14 may be patterned by conventional known methods of photolithographic patterning techniques and plasma etching in a plasma containing $Cl_2$ to create an opening to the bonding pad.

Figure 2:
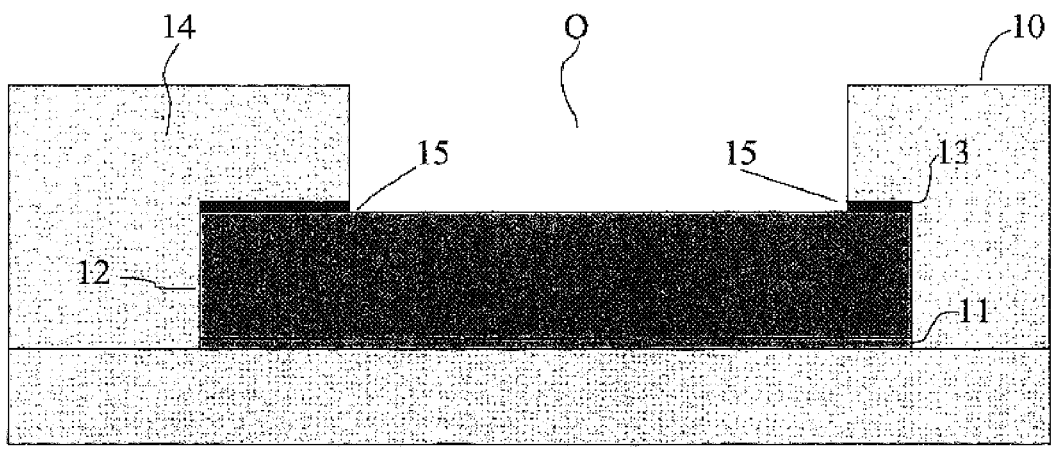
FIG. 2 is a simplified cross sectional view of an IC of the invention depicting a Ti based liner on which there is deposited a metal layer of Al or its compound, as shown in FIG. 1, followed by plasma etching in a plasma containing $Cl_2$, of a fuse region and/or another region or area where a bonding pad is to be formed.

Portions of the W based redundancy layer 13 and passivation layer 14, as shown in the IC chip structure of FIG. 2 are patterned, as mentioned above, by known photolithographic patterning methods and plasma etching in plasma containing $Cl_2$ to create an opening 0 where the W based redundancy layer has been removed at the bond pad area 15, to support superior packaging of the IC chip.

Further, the plasma etching by fluorine based chemistry of the W yields a big advantage when the final passivation over the bond pad is removed, in that W, unlike Ti and its compounds, is quickly and completely removed.

In summarization, the bond pad structure of the invention is formed over a predetermined area of an IC substrate comprising quickly and easily removable redundancy and passivation layers upon lithography and plasma etching in a plasma containing $Cl_2$, said bond pad structure comprising:

a liner or lower metal layer formed on a predetermined area of the IC substrate;

an aluminum-based metal layer formed on said liner layer as the last metal layer for bond purposes;

a tungsten based redundancy layer formed on top of said aluminum-based last metal layer; and a passivation layer formed over the IC substrate and on said tungsten based redundancy layer.

While the invention has been described with reference to preferred embodiments thereof, it is to be understood by those skilled in the art that many changes in form and detail may be made without departing from the spirit and scope of the invention, which is defined by the appended claims.

We claim:

1. In a bond pad structure formed over a predetermined area of an IC substrate, the improvement comprising quickly and easily removable redundancy and passivation layers upon lithography and plasma etching in a plasma containing $Cl_2$, said bond pad structure comprises:
   a) a Ti based liner layer formed on a predetermined area of the IC substrate;
   b) an aluminum-based metal layer formed on said Ti based liner layer as the last metal layer for bond purposes;
   c) a redundancy layer of $WSi_2$ formed on top of said aluminum-based last metal layer; and
   d) a passivation layer formed over the IC substrate and on said redundancy layer.

2. The bond pad substrate of claim 1, wherein said Ti based liner layer is selected from the group consisting of Ti, TiN and TiW.

3. The bond pad structure of claim 2, wherein said Ti based liner layer is Ti.

4. The bond pad structure of claim 2, wherein said Ti based liner layer is TiN.

5. The bond pad structure of claim 2, wherein said Ti based liner layer is TiW.

6. The bond pad structure of claim 1, wherein said aluminum based metal layer is selected from the group consisting of Al, AlCu and AlCuSi.

7. The bond pad structure of claim 6, wherein said aluminum based metal layer is Al.

8. The bond pad structure of claim 6, wherein said aluminum based metal layer is AlCu.

9. The bond pad structure of claim 6, wherein said aluminum based metal layer is AlCuSi.

10. In a bond pad structure formed over a predetermined area of an IC substrate, the improvement comprising quickly and easily removable redundancy and passivation layers upon lithography and plasma etching in a plasma containing $Cl_2$, said bond pad structure comprises:
    a) a Ti based liner layer formed on a predetermined area of the IC substrate;
    b) an aluminum-based metal layer formed on said Ti based liner layer as the last metal layer for bond purposes;
    c) a tungsten based redundancy layer formed on top of said aluminum-based last metal layer; and
    d) a non-titanium containing passivation layer formed over the IC substrate and on said tungsten based redundancy layer.

11. The bond pad structure of claim 10, wherein said Ti based liner layer is Ti.

12. The bond pad structure of claim 10, wherein said Ti based liner layer is TiN.

13. The bond pad structure of claim 10, wherein said Ti based liner layer is TiW.

14. The bond pad structure of claim 10, wherein said aluminum based metal layer is Al.

15. The bond pad structure of claim 10, wherein said aluminum based metal layer is AlCu.

16. The bond pad structure of claim 10, wherein said aluminum based metal layer is AlCuSi.

17. The bond pad structure of claim 10, wherein said tungsten based redundancy layer is W.

18. The bond pad structure of claim 10, wherein said tungsten based redundancy layer is $WSi_2$.

* * * * *